United States Patent
Watanabe et al.

(10) Patent No.: US 6,459,380 B1
(45) Date of Patent: Oct. 1, 2002

(54) SEMICONDUCTOR APPARATUS WITH ALARM PREDICTING MEANS

(75) Inventors: Manabu Watanabe; Tamao Kajiwara, both of Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 09/576,383

(22) Filed: May 22, 2000

(30) Foreign Application Priority Data

May 27, 1999 (JP) .......................................... 11-147550

(51) Int. Cl.[7] .............................................. G08B 21/00
(52) U.S. Cl. ......................... 340/635; 340/639; 340/644
(58) Field of Search .................................. 340/635–656

(56) References Cited

U.S. PATENT DOCUMENTS 5,283,553 A * 2/1994 Ishii et al. .................. 340/664
5,998,886 A * 12/1999 Hoshino et al. .............. 307/66

* cited by examiner

*Primary Examiner*—Daniel J. Wu
*Assistant Examiner*—Sihong Huang
(74) *Attorney, Agent, or Firm*—Kanesaka & Takeuchi

(57) ABSTRACT

A semiconductor apparatus, including an intelligent power module, facilitates preventing sudden stop of an inverter due to an anomaly from affecting a factory operation adversely. When an anomaly occurs in IGBTs of the inverter, one of protection circuits outputs an alarm signal via an alarm enable line. In advance to the alarm signal, when the protection circuit detects a sign of a possible anomaly from a collector current or a chip temperature of any of the IGBTs exceeding a second predetermined collector current level or a second predetermined temperature level higher than the normal collector current value or the normal chip temperature but lower than a first predetermined collector current level or a first predetermined temperature level for outputting the alarm signal, the protection circuit outputs a preliminary alarm signal via a preliminary alarm line without turning off the pertinent IGBT.

7 Claims, 6 Drawing Sheets

Driver input
VinX~VinZ, VinDB

Collector current Ic

ALM2 Preliminary alarm output

ALM1 Alarm output (Operation stop)

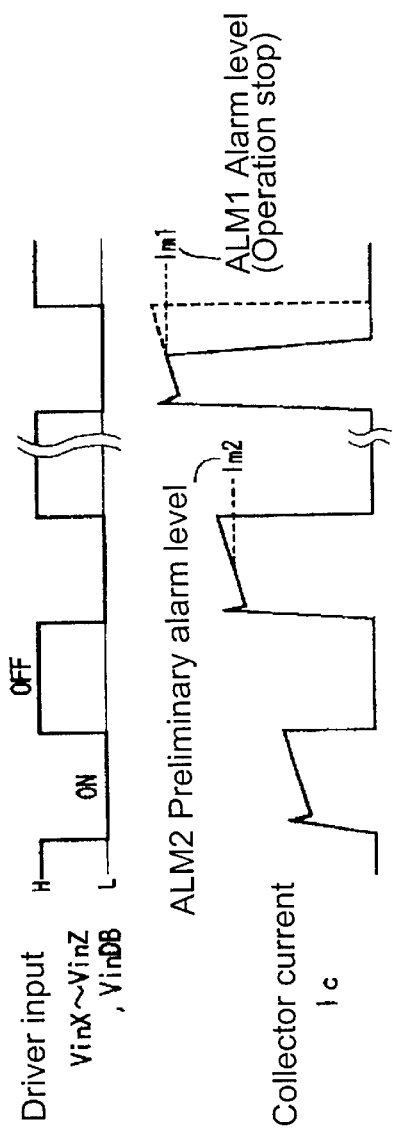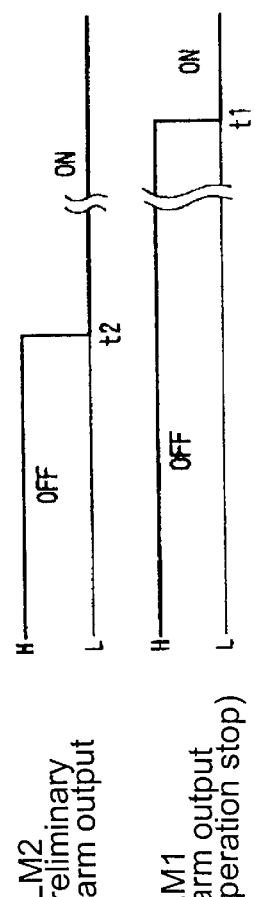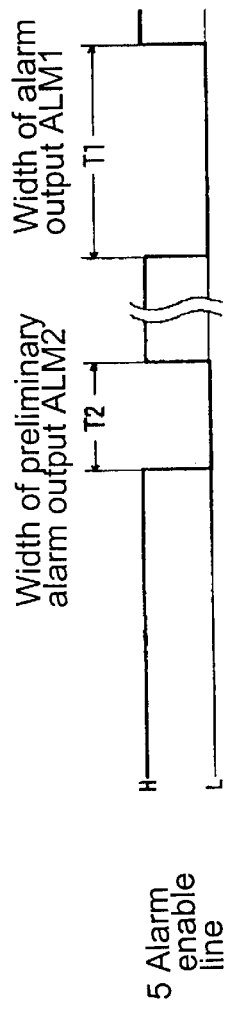

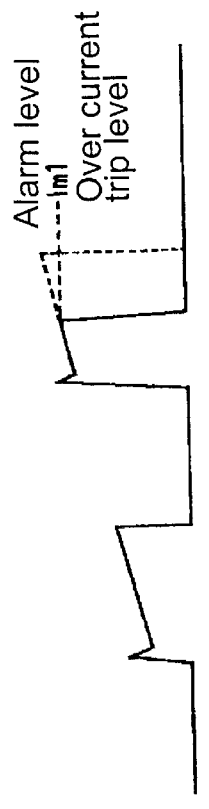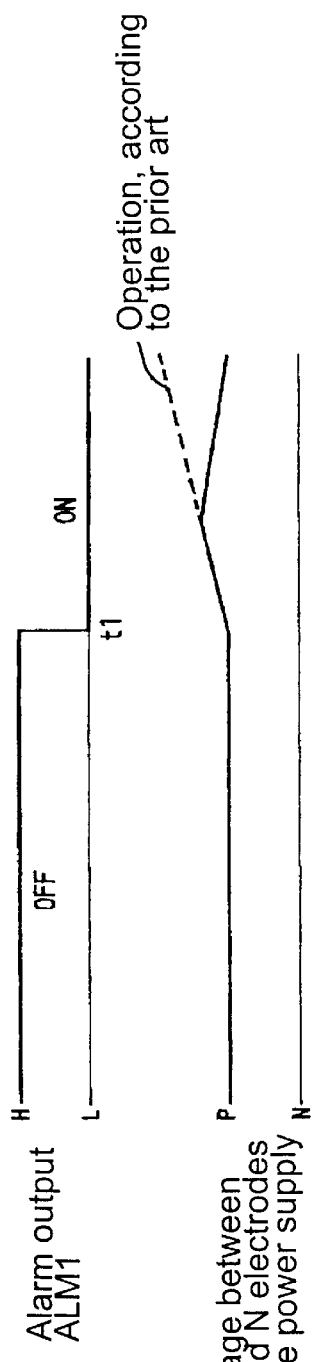
Fig. 5(a) Driver input to the inverter switch VinX~VinZ
Fig. 5(b) Collector current of the inverter switch Ic
Fig. 5(c) Alarm output ALM1
Fig. 5(d) Voltage between P and N electrodes of the power supply

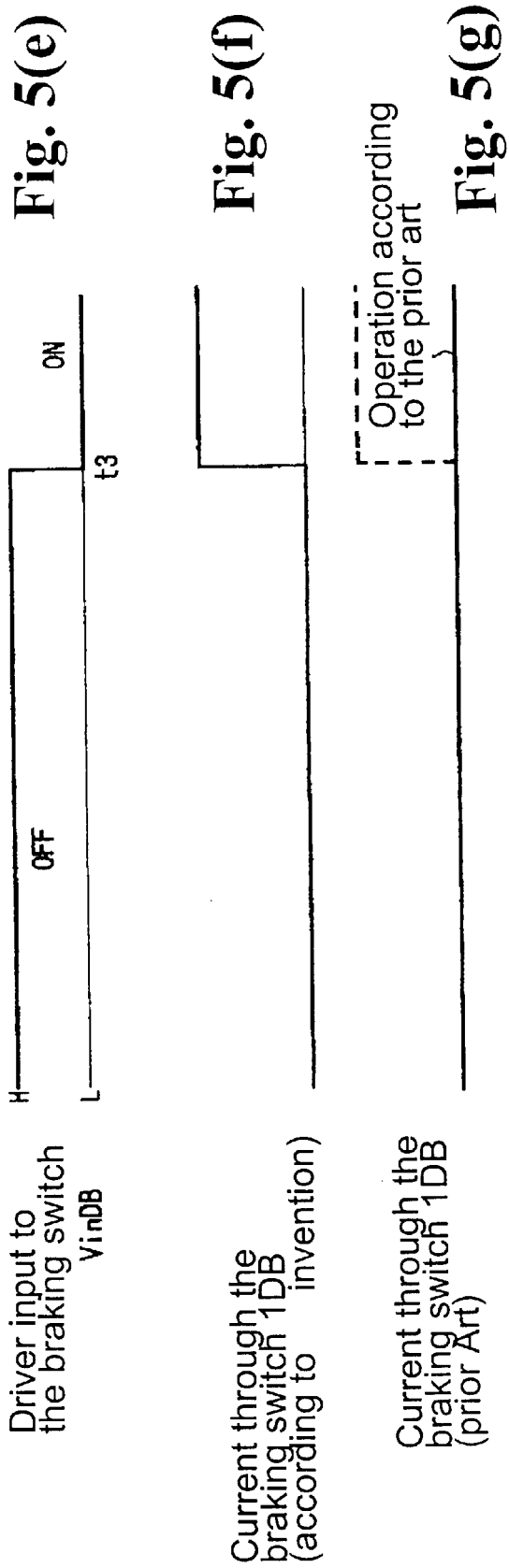

SEMICONDUCTOR APPARATUS WITH ALARM PREDICTING MEANS

BACKGROUND OF THE INVENTION AND RELATED ART STATEMENT

The present invention relates to a semiconductor apparatus incorporated in a power converting apparatus, such as an inverter, for variably controlling the speed of a motor. More specifically, the present invention relates to a so-called intelligent power module (hereinafter referred to as an "IPM") that incorporates semiconductor switching devices for power conversion, driver circuits for driving the respective semiconductor switching devices and various protection circuits in a package.

FIG. 6 is a block diagram showing a main portion of a conventional inverter for variably controlling the speed of a motor including an intelligent power module (IPM). In the figure, there are shown an IPM 01, a main DC power supply 02 formed of a rectifier circuit (not shown) in a main control board 05 of the inverter, a motor 03, the speed thereof being variably controlled by the inverter, and a resistor 04 in the main control board 05 of the inverter for consuming regenerated electric power. The resistor 04 will be described later in detail.

The main control board 05 of the inverter includes the above described rectifier circuit that constitutes the main DC power supply 02, and the control circuits which generate various control signals for controlling the IPM 01.

The IPM01 includes semiconductor switching devices which also work as sensing IGBTs 1 (1U through 1Z and 1DB), each having a sensing terminal SE for dividing the emitter current thereof and for detecting anomaly in the emitter current caused by a short circuit in the load and so on. In the following, the IGBTs 1U through 1Z will be sometimes referred to as the "inverter switches" and the IGBT 1DB as a "braking switch".

The IPM01 includes free wheel diodes 2 (2U through 2Z and 2DB). Each of the free wheel diodes 2U through 2Z is connected in opposite parallel between the collector and the emitter of each of the IGBTs (inverter switches) 1U through 1Z. The free wheel diode 2DB is connected in parallel to the resistor 04 in such a polarity that the cathode of the diode 2DB is connected to the positive electrode P of the main DC power supply 02.

The IPM01 includes pre-drivers 3 (3U through 3Z and 3DB) disposed in one to one correspondence to the IGBTs 1 (1U through 1Z and 1DB). In FIG. 6, one pre-driver is used to drive one IGBT. Alternatively, one pre-driver may be used to drive all the inverter switches 1U through 1Z, two pre-drivers may be used to drive the inverter switches on the upper arm and the inverter switches on the lower arm respectively, or one pre-driver may be used to drive all the inverter switches 1U through 1Z and the braking switch 1DB.

The IGBTs 1U and 1X are connected in series to each other and in forward between the positive electrode P and the negative electrode N of the main DC power supply 02 such that the IGBT 1U is on the upper arm and the IGBT 1X is on the lower arm of the inverter bridge. The IGBTs 1V and 1Y are connected in series to each other and in forward between the positive electrode P and the negative electrode N of the main DC power supply 02 such that the IGBT 1V is on the upper arm and the IGBT 1Y is on the lower arm. And, the IGBTs 1W and 1Z are connected in series to each other and in forward between the positive electrode P and the negative electrode N of the main DC power supply 02 such that the IGBT 1W is on the upper arm and the IGBT 1Z is on the lower arm.

Six inverter switches, i.e. IGBTs 1U through 1Z, constitute a three-phase inverter bridge circuit. The mutual connection point of the IGBTs 1U and 1X is connected to an output terminal U for the U phase of a three-phase alternating current. The mutual connection point of the IGBTs 1V and 1Y is connected to an output terminal V for the V phase of the three-phase alternating current. And, the mutual connection point of the IGBTs 1W and 1Z is connected to an output terminal W for the W phase of the three-phase alternating current. The output terminals U, V and W are connected to the motor (three-phase induction motor in FIG. 6) 03.

The braking switch, i.e. IGBT 1DB, is connected in series to the resistor 04 for consuming the regenerated electric power and in forward relative to the P and N electrodes of the main DC power supply 02.

Each of the pre-drivers 3U through 3Z and 3DB includes a circuit for driving the gate of the corresponding IGBT and a protection circuit. A driving power supply (DC 15 V in FIG. 6) is fed to the pre-drivers 3U through 3Z and 3DB. Basically, each of the pre-drivers 3U through 3Z and 3DB works as a driver circuit which feeds a gate signal, indicative of ON or OFF of the corresponding IGBT, between the gate and the emitter thereof, when an ON-signal or an OFF signal (hereinafter referred to as a "driver input") is inputted from the main control board 05 of the inverter to the correspond one of the terminals VinU through VinZ and VinDB, to switch on or off the corresponding IGBT.

Usually, a three-phase AC voltage, wherein the voltage and the frequency thereof are variable, is generated through the IGBTs 1U through 1Z which convert the electric power from the main DC power supply 02 to control the speed of the motor 03 variably.

When the output frequency of the inverter is decreased to decelerate or stop the motor 03 while the motor 03 is driven, the energy of the motor 03 is regenerated to the main DC power supply 02, and the voltage between the electrodes P and N of the DC power supply 02 rises. As the voltage rises too much, an over voltage exceeding the breakdown voltages of the IGBTs and the smoothing capacitor in the DC power supply 02 may be applied thereto.

To avoid this, the main control board 05 of the inverter monitors the voltage between the electrodes P and N of the DC power supply 02. When the voltage between the electrodes P and N of the DC power supply 02 exceeds a predetermined value, the control circuit feeds ON and OFF signals to the input terminal VinDB of the pre-driver 3DB for the braking switch, i.e. IGBT 1DB, to intermittently switch the IGBT 1DB. As the IGBT 1DB is switched intermittently, the electric power regenerated from the motor 03 to the DC power supply 02 is bypassed to the resistor 04 to consume therein the regenerated electric power. Thus, the voltage between the electrodes of the main DC power supply 02 is prevented from increasing too much.

The pre-drivers 3 described above exhibit the function of driving of the IGBTs, and other various protection functions, such as (A) protection against short circuit, (B) protection against a low voltage, (C) protection against an overcurrent, and (D) protection against overheat of the IGBTs.

In the protection against short circuit (A), the pre-drivers 3 monitor the output currents from the sensing terminals SE of the IGBTs at a high speed. When any one of the monitored output currents exceeds a predetermined level, for example, at a value from 4 to 5 times greater than the rated current, the pertinent pre-driver 3 turns off the corresponding IGBT in a very short time by the so-called soft interruption that lowers the gate voltage at first and, then, turns off the IGBT, so that the pertinent IGBT may be protected.

The protection against the low voltage (B) is conducted to keep the gate voltages of the IGBTs at an optimum value. In the protection against the low voltage (B), the pre-drivers 3 monitor the driving voltages, to which the pre-drivers 3 feed. When any one of the monitored driving voltages is lower than a predetermined value, the pertinent pre-driver 3 turns off the corresponding IGBT so that the IGBT may be protected.

In the overcurrent protection (C), the pre-drivers 3 monitors the output currents from the sensing terminals SE of the IGBTs. When any one of the monitored output currents exceeds a predetermined level, for example, 1.5 to 2 times greater than the rated current, the pertinent pre-driver 3 turns off the corresponding IGBT. The detection speed and the detection level for the overcurrent protection (C) are different from those for the short circuit protection (A).

In the overheat protection (D), the pre-drivers 3 monitor the temperatures of the chips, in which the respective IGBTs are buried, by detecting the forward currents of the diodes buried in the chips. When any one of the monitored temperatures exceeds a predetermined temperature, the pertinent pre-driver 3 turns off the corresponding IGBT.

There is shown an overheat protection circuit 4 in the bottom of FIG. 6. Usually, the signal on an alarm enable line 5 is set at a high level Hi. When any one of the temperatures of metallic or ceramic insulation substrates, which insulate the chips of the IGBTs 1U through 1Z and 1DB from the respective metallic radiator substrates, exceeds a predetermined temperature, the overheat protection circuit 4 sets the signal on the alarm enable line 5, usually at a high level Hi, to a low level Lo to output an alarm signal ALM at the low level Lo.

When any one of the pre-drivers 3X through 3Z, which drive the IGBTs 1X through 1Z constituting the lower arm of the inverter bridge circuit, executes any one of the protection operations (A) through (C), the pertinent pre-driver 3X, 3Y or 3Z sets the signal on the alarm enable line 5 at the low level Lo to output an alarm signal ALM at the low level Lo, similarly as the overheat protection circuit 4 does.

When the alarm signal ALM is outputted, i.e. when alarm enable line 5 is active, the pre-drivers which have not outputted the alarm signal ALM detect the alarm signal ALM at the low level Lo and turn off the respective IGBTs.

When the main control board 05 of the inverter detects the alarm signal ALM at the low level Lo, the main control board 05 of the inverter outputs an OFF-signal to the pre-drivers 3U through 3W which drive the IGBTs 1U through 1W on the upper arm of the inverter bridge circuit to turn off the IGBTs 1U through 1W. Thus, when any one of the pre-drivers 3U through 3Z and 3DB and the overheat protection circuit 4 executes any one of the protection operations, all the IGBTs 1U through 1Z and 1DB are turned off.

As described above, the conventional IPM exhibits the protection functions mainly to protect the semiconductor devices that the IPM incorporates against anomalies and to avoid breakdown of the semiconductor devices. As soon as the IPM detects an anomaly, all the IGBTs are turned off to stop the operation of the inverter.

Therefore, if an anomaly occurs in the inverter, breakdown of the semiconductor devices is avoided. However, when an inverter operated in a manufacturing line in an unnoticeable overloaded state suddenly stops, the operation of an entire factory system slows down or stops.

Especially in a large manufacturing line, tremendous loses are caused. Therefore, it is desired to avoid slowdown or stop of the operation of the factory system by detecting a sign indicating possible anomalous stop of the inverter, by outputting a preliminary alarm signal and by guiding the operator of the inverter to remove the cause which may cause anomalous stop of the inverter in advance to real anomalous stop of the inverter.

As described above, as soon as any one of the pre-drivers 3X through 3Z for the inverter switches detects an anomaly, the signal on the alarm enable line 5 is set at the low level Lo, thereby the operation of the braking switch, i.e. IGBT 1DB, is also stopped.

When the operation of the inverter circuit is stopped suddenly by an anomaly caused in the inverter switches, the energy of the rotating motor 03, i.e. load, is regenerated back to the main DC power supply 02, and the voltage across the main DC power supply 02 is raised.

As described above, when the main control board 05 of the inverter detects the rise of the voltage across the main DC power supply 02, usually, the control circuit makes the braking IGBT 1DB work to suppress the rise of the voltage across the main DC power supply 02. However, once the pre-driver 3DB, that detected the low signal level Lo on the alarm enable line 5, has turned off the braking IGBT 1DB, the braking IGBT 1DB never operates even when an ON-signal is fed to the input terminal VinBD of the pre-driver 3DB. Therefore, the voltage across the main DC power supply 02 is not prevented from rising, and in the worst case, breakdown of the constituent elements of the IPM occurs.

In view of the foregoing, it is an abject of the invention to provide a semiconductor apparatus including an IMP that facilitates outputting a preliminary alarm signal without stopping the inverter when a sign of an anomaly in the IPM is detected, guiding removal of the cause which may cause anomalous stop of the inverter, and preventing the operation of the factory system from sudden slowdown or sudden stop.

It is another object of the invention to provide a semiconductor apparatus including an IMP that facilitates intermittently switching the braking IGBT, and thereby, preventing the voltage across the main DC power supply from rising even when any one of the inverter switches is turned off due to an anomaly and the inverter is stopped.

SUMMARY OF THE INVENTION

According to a first aspect of the invention, there is provided a semiconductor apparatus including: one or more semiconductor switching devices for electric power conversion; one or more driver circuits disposed in the corresponding one or more semiconductor switching devices, the one or more driver circuits switching on and off the corresponding one or more semiconductor switching devices via the respective control terminals in response to an ON/OFF command inputted thereto from the outside; one or more anomaly protection means disposed in the corresponding one or more semiconductor switching devices, the one or more anomaly protection means monitoring the corresponding one or more semiconductor switching devices and ordering the corresponding one or more driver circuits to turn off the corresponding one or more semiconductor switching devices when the one or more anomaly protection means have detected an anomaly in the corresponding one or more semiconductor switching devices; and one or more anomaly predicting means disposed in the corresponding one or more semiconductor switching devices, the one or more anomaly predicting means outputting a preliminary alarm signal when the one or more anomaly predicting means have detected a sign of an anomaly corresponding to the one or more semiconductor switching devices.

Advantageously, the one or more anomaly protection means judge that the anomaly occurs in the corresponding one or more semiconductor switching devices when the current flowing between the main terminals of the corresponding one or more semiconductor switching devices has exceeded a first predetermined value higher than the normal value of the current, and the one or more anomaly predicting means output the preliminary alarm signal when the current flowing between the main terminals of the corresponding one or more semiconductor switching devices has exceeded a second predetermined value higher than the normal value of the current but lower than the first predetermined value.

Advantageously, the one or more anomaly protection means judge that the anomaly is caused in the corresponding one or more semiconductor switching devices when the chip temperature of the corresponding one or more semiconductor switching devices has exceeded a first predetermined temperature higher than the normal chip temperature, and the one or more anomaly predicting means output the preliminary alarm signal when the chip temperature of the corresponding one or more semiconductor switching devices has exceeded a second predetermined temperature higher than the normal chip temperature but lower than the first predetermined temperature.

Advantageously, the one or more anomaly protection means output the alarm signal when the one or more anomaly protection means judge that the anomaly occurs in the corresponding one or more semiconductor switching devices.

Advantageously, the preliminary alarm signal and the alarm signal are digital signals, wherein the pulse widths thereof are different from each other, and the digital signals are outputted from a common output terminal.

According to a second aspect of the invention, there is provided a semiconductor apparatus including: a main circuit for an inverter for driving a motor; one or more inverter semiconductor switches; a braking semiconductor switch for turning on and off a current, thereby to consume energy regenerated from the motor; driver circuits disposed in the corresponding one or more inverter semiconductor switches and the braking semiconductor switch, the driver circuits switching on and off the corresponding one or more inverter semiconductor switches and the braking semiconductor switch via the respective control terminals in response to an ON/OFF command inputted thereto from the outside; anomaly protection means disposed in the corresponding one or more inverter semiconductor switches and the braking semiconductor switch, the anomaly protection means monitoring the corresponding one or more inverter semiconductor switching devices and the braking semiconductor switching device, and ordering the corresponding driver circuits to turn off the corresponding one or more inverter semiconductor switches and the braking semiconductor switch when the anomaly protection means have detected an anomaly in the corresponding one or more inverter semiconductor switches and the braking semiconductor switch; alarm signal outputting means disposed in the corresponding one or more inverter semiconductor switches and the braking semiconductor switch, each of the alarm signal outputting means outputting an alarm signal through a common signal line when the anomaly occurs in the corresponding one or more inverter semiconductor switches and the braking semiconductor switch; and one or more alarm signal receiving means disposed in the corresponding one or more inverter semiconductor switches. The one or more alarm signal receiving means order the corresponding anomaly protection means to turn off the corresponding one or more inverter semiconductor switches in response to the alarm signal inputted from the alarm signal outputting means of the other inverter semiconductor switch through the common signal line.

Advantageously, the one or more alarm signal receiving means turn off the one or more inverter semiconductor switches.

The characteristics of the semiconductor apparatus according to the invention are as follows.

According to the first aspect of the invention, as soon as a sign of the anomaly in any one of the inverter switches is detected, the IPM outputs a preliminary alarm signal ALM2, without stopping the electric power conversion, in advance to turning off the inverter switches to remove the cause of the anomaly.

The sign of the anomaly in any one of the inverter switches is detected at an instance when the collector current or the chip temperature of any one of the inverter switches exceeds a predetermined value higher than the normal value but lower than the anomalous value.

When the common terminal is used for outputting the alarm signal indicating the anomaly from the IPM and for outputting the preliminary alarm signal indicating a sign of the anomaly from the IPM, the pulse widths of the alarm signal and the preliminary alarm signal are set to be different from each other.

The preliminary detection of a sign of the anomaly facilitates removing the causes which may cause a real anomaly and avoiding anomalous sudden stop of the inverter in advance.

According to the second aspect of the invention, when the anomaly occurs in any one of the inverter switches and the braking switch, the corresponding pre-driver turns off the pertinent switch and outputs an alarm signal via a common signal line. The other pre-drives of the inverter switches, which have received the alarm signal via the common signal line, turn off the corresponding inverter switches.

The pre-driver for the barking switch does not turn off the barking switch even when the alarm signal is outputted from one of the pre-drivers for the inverter switches.

Even when the inverter stops suddenly and the power supply voltage rises due to the regenerated energy from the motor, the power supply voltage is prevented from further rising by consuming the regenerated energy by the ON/OFF operation of the braking switch.

BRIEF DESCRIPTION OF THE DRAWINGS

FIGS. 3(a)–3(d) show timing charts for explaining an overcurrent protection according to the first embodiment of the invention;

FIG. 4 shows wave forms of an alarm signal and a preliminary alarm signal on a common alarm signal line according to a third embodiment of the invention;

FIGS. 5(a)–5(g) show timing charts for explaining operations of a braking IGBT according to a fourth embodiment of the invention.

DETAILED DESCRIPTION OF PREFERRED EMBODIMENTS

Figure 6:
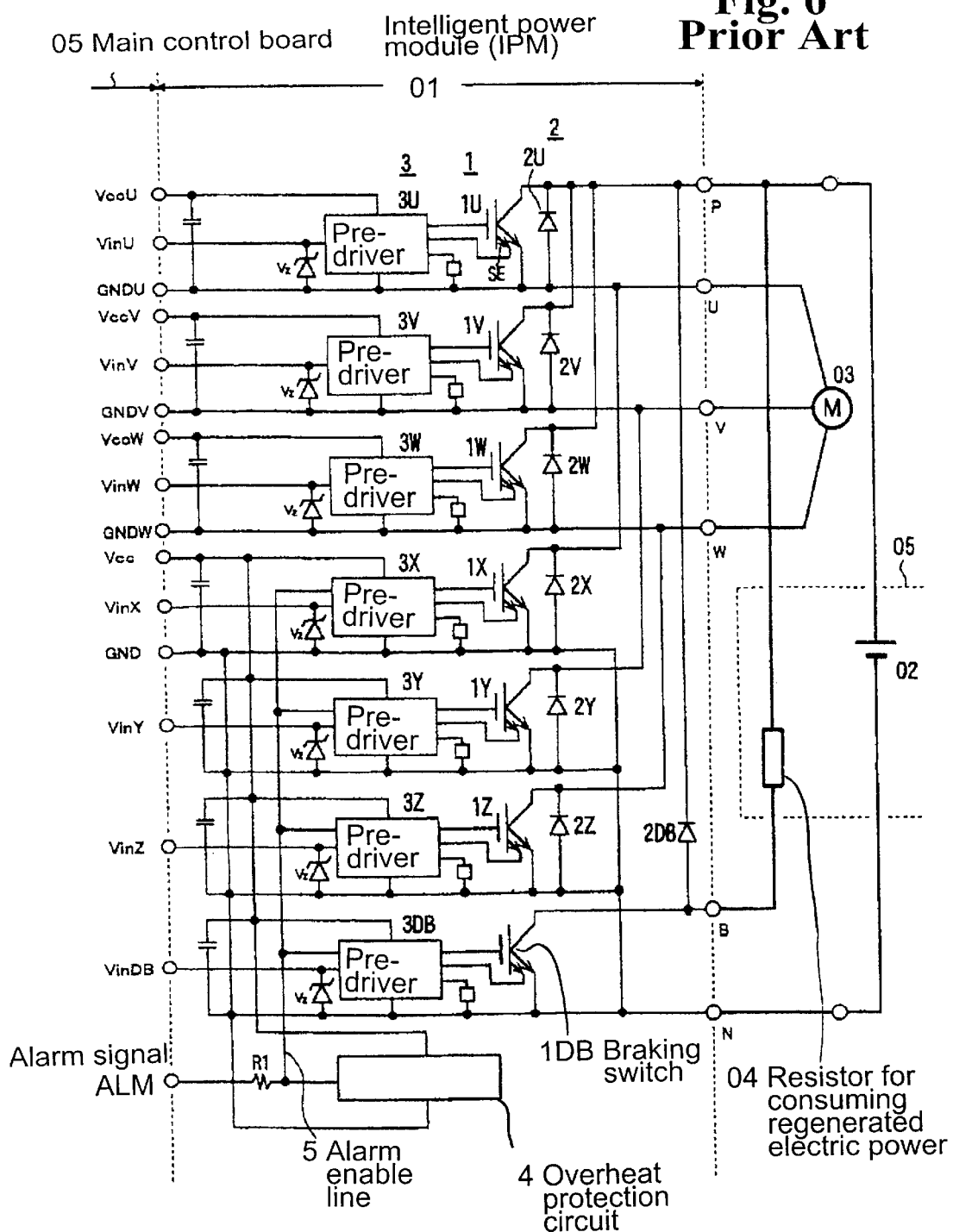
FIG. 6 is a block diagram showing a main portion of a conventional inverter for variably controlling the speed of a motor including an intelligent power module.

Now the invention will be explained hereinafter with reference to the accompanied drawings which illustrate preferred embodiments of the invention. Throughout the following drawings, the same reference numerals as used in FIG. 6 are used to designate the same or corresponding constituent elements.

First Embodiment

Figure 1:
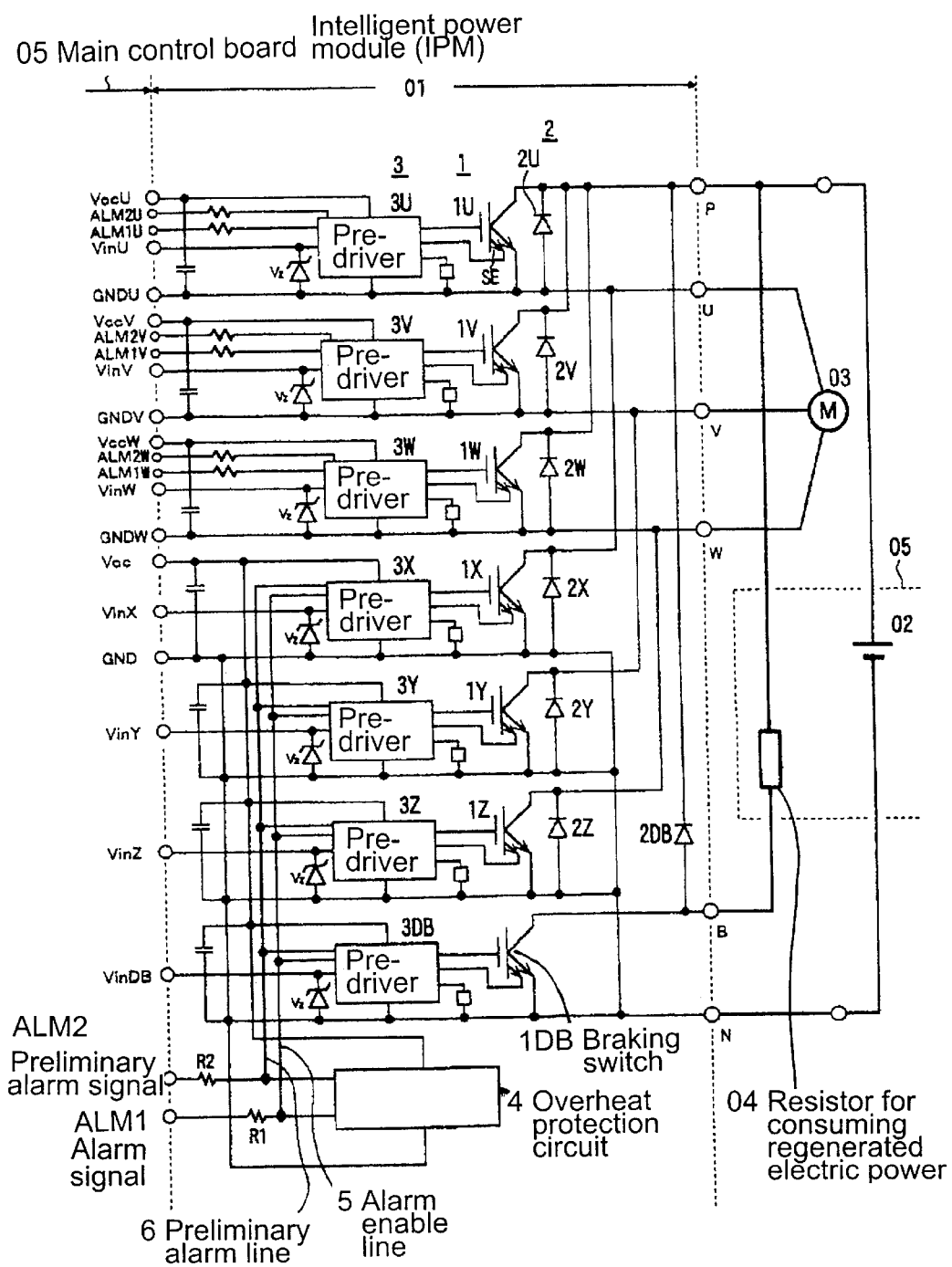
FIG. 1 is a block diagram showing a main portion of an inverter for variably controlling the speed of a motor according to a first embodiment of the invention including an intelligent power module (IPM)

FIG. 1 is a block diagram showing a main portion of an inverter for variably controlling the speed of a motor according to the first embodiment of the invention including an intelligent power module (IPM) 01. Referring now to FIG. 1, the IPM 01 includes pre-drivers 3X through 3Z and 3DB which output alarm signals ALM 1 to a main control board 05 of the inverter via an alarm enable line 5, as usual. The inverter according to the first embodiment is different from the conventional inverter in that the inverter according to the first embodiment includes a preliminary alarm line 6, through which the pre-drivers 3X through 3Z and 3DB output preliminary alarm signals ALM 2, and in that the pre-drivers 3U through 3W for the inverter switches on the upper arm also output respective alarm signals ALM1U through ALM1W and respective preliminary alarm signals ALM2U through ALM2W.

By making the pre-drivers 3U through 3W output respective alarm signals ALM1U through ALM1W and respective preliminary alarm signals ALM2U through ALM2W, more precise control may be executed. The functions of the pre-drivers may be assigned to one or less number of pre-drivers as in the conventional pre-divers.

FIGS. 3(a)–3(d) show timing charts for explaining the overcurrent protection according to the first embodiment. The timing chart in FIG. 3(a) shows a typical wave form of an ON/OFF command (driver input) VinX, VinY, VinZ or VinDB inputted to the pre-driver 3X, 3Y, 3Z or 3DB from the main control board 05 of the inverter. The timing chart in FIG. 3(b) shows a typical wave form of a collector current of any one of the IGBTs 1X through 1Z and 1DB flowing in response to the foregoing ON/OFF command when an overcurrent anomaly occurs.

The timing chart in FIG. 3(c) shows the output timing of the preliminary alarm signal ALM2 outputted from the pertinent pre-driver 3X, 3Y, 3Z or 3DB based on the collector current of FIG. 3(b). The timing chart in FIG. 3(d) shows the output timing of the alarm signal ALM1.

Even when the upper arm of the inverter is not provided with the alarm output function, the wave forms in FIGS. 3(a) and 3 (b) are applied also to the inverter switches 1U through 1W on the upper arm. The pre-drivers 3U through 3W for the inverter switches on the upper arm also execute the protecting operation at an alarm level Im1 of the collector current, though the pre-drivers 3U through 3W do not output the alarm signal ALM1.

As shown in FIGS. 3(a)–3(d), when the pre-driver 3X, 3Y, 3Z or 3DB detects anomalous increase of the collector current of the corresponding IGBT that reaches the alarm level Im1 at a time t1, the pertinent pre-driver 3X, 3Y, 3Z or 3DB stops the operation of the corresponding IGBT in the same manner as the conventional inverter does, and sets the signal on the alarm enable line 5 at a low level Lo to output the alarm signal ALM1. In advance, as soon as the collector current exceeding the normal value reaches a preliminary alarm level Im2 at a time t2, the pertinent pre-driver 3X, 3Y, 3Z or 3DB sets the signal on the preliminary alarm line 6 at a low level Lo to output a preliminary alarm signal ALM2 to the main control board 05 of the inverter.

In this case, only the preliminary alarm signal ALM2 is outputted, and the corresponding IGBT is not turned off. The low signal level Lo on the preliminary alarm line 6 does not affect the other pre-drivers connected to the preliminary alarm line 6.

Second Embodiment

Figure 2A:
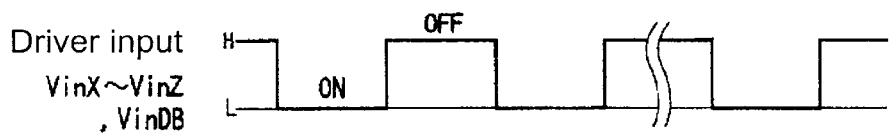
FIGS. 2(a)–2(e) show timing charts for explaining an overheat protection according to a second embodiment of the invention.
Figure 2B:
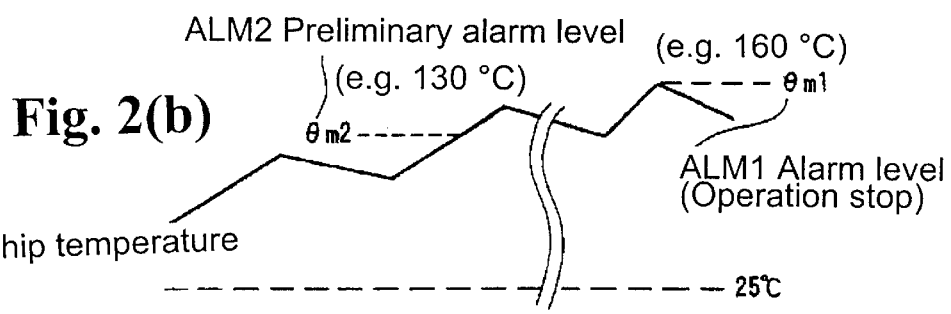
Figure 2C:
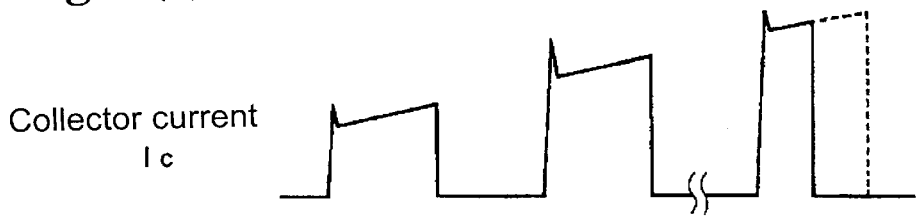

FIGS. 2(a)–2(e) show timing charts for explaining the overheat protection according to the second embodiment of the invention. The timing chart in FIG. 2(a) shows a typical wave form of a driver input VinX, VinY, VinZ or VinDB inputted to the pre-driver 3X, 3Y, 3Z or 3DB from the main control board 05 of the inverter. The timing chart in FIG. 2(c) shows a typical wave form of a collector current of any one of the IGBTs 1X through 1Z and 1DB flowing in response to the foregoing driver input. The timing chart in FIG. 2(b) shows a typical temperature change, including anomalous heat-up of the IGBT chip, caused by the collector current in FIG. 2(c).

Figure 2D:
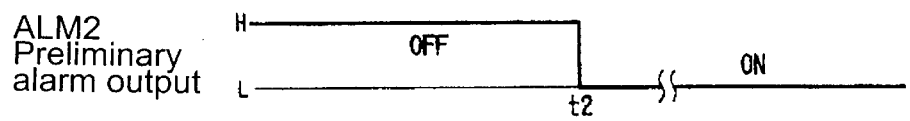
Figure 2E:
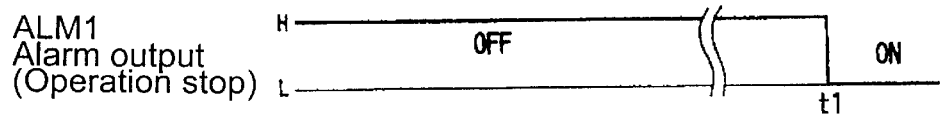

The timing chart in FIG. 2(d) shows the output timing of the preliminary alarm signal ALM2 outputted from the pertinent pre-driver 3X, 3Y, 3Z or 3DB based on the chip temperature detection in FIG. 2(b). The timing chart in FIG. 2(e) shows the output timing of the alarm signal ALM1.

The wave forms in FIGS. 2(a) and 2(c) are applied also to the inverter switches 1U through 1W on the upper arm. The pre-drivers 3U through 3W for the inverter switches on the upper arm also execute protecting operation at an alarm level $\theta m1$ for the temperature of the corresponding IGBT chip, though the pre-drivers 3U through 3W do not output the alarm signal ALM 1.

As shown in FIGS. 2(a)–2(e), when the pre-driver 3X, 3Y, 3Z or 3DB detects anomalous heat-up of the corresponding IGBT chip that reaches the alarm level $\theta m1$ (from 160 to 170° C.) at a time t1, the pertinent pre-driver 3X, 3Y, 3Z or 3DB stops the operation of the corresponding IGBT in the same manner as the conventional inverter does, and sets the signal on the alarm enable line 5 at a low level Lo to output an alarm signal ALM1. In advance, as soon as the chip temperature exceeding the normal value reaches the preliminary alarm level $\theta m2$, e.g. 130° C. at a time t2, the pertinent pre-driver 3X, 3Y, 3Z or 3DB sets the signal on the preliminary alarm line 6 at a low level Lo to output a preliminary alarm signal ALM2 to the main control board 05 of the inverter.

In case only the preliminary alarm signal ALM2 is outputted, the corresponding IGBT will not be turned off. The low signal level Lo on the preliminary alarm line 6 does not affect the other pre-drivers connected to the preliminary alarm line 6.

Third Embodiment

In the first and second embodiments, the alarm enable line 5 for outputting the alarm signal ALM1 and the preliminary alarm line 6 for outputting the preliminary alarm signal ALM2 are used. Alternatively, one alarm signal line may be used commonly for outputting the alarm signal ALM1 and for outputting the preliminary alarm signal ALM2. That is, the conventional output terminals used for outputting the alarm signal ALM1 may be used also for outputting the preliminary alarm signal ALM2.

FIG. 4 shows the wave forms of the alarm signal and the preliminary alarm signal on a common alarm signal line, i.e. on the common output terminal for outputting the alarm signals. As shown in FIG. 4, the output width T2, for which the signal is set at the low level Lo, for the preliminary alarm signal ALM2 and the output width T1, for which the signal is set at the low level Lo, for the alarm signal ALM1 are different so that these alarm signals ALM1 and ALM2 are distinguishable form each other.

Fourth Embodiment

In FIGS. 2(a)–2(e) and 3(a)–3(d), when the collector current or the chip temperature, after the preliminary alarm signal ALM2 was outputted, reaches the alarm level Im1 or θm1 for outputting the alarm signal ALM1, the pertinent pre-driver 3X, 3Y, 3Z or 3DB turns off the corresponding IGBT, sets the signal on the alarm enable line 5 at the low level Lo and outputs the alarm signal ALM1 at the low signal level Lo to the main control board 05 of the inverter.

As soon as the other pre-drivers, which did not output the alarm signal ALM1, detect the low signal level Lo on the alarm enable line 5, the other pre-drivers turn off the corresponding IGBTs.

In contrast, according to the fourth embodiment of the invention, the pre-driver 3DB for the breaking switch does not turn off the corresponding IGBT 1DB even when the signal on the alarm enable line 5 is set at the low level Lo.

According to the fourth embodiment of the invention, even when the signal on the alarm enable line 5 is set at the low level Lo in association with the protecting operation and the output of the alarm signal ALM1 by any one of the pre-drivers 3X though 3Z connected to the alarm enable line 5, the pre-driver 3DB for the braking IGBT 1DB does not turn off the IGBT 1DB so that the IGBT 1DB may keep executing the switching operation (as far as the pre-driver 3DB has not outputted the alarm signal ALM1).

FIGS. 5(a)–5(g) show the timing charts for explaining the operation of the braking IGBT 1DB according to the fourth embodiment of the invention.

The timing chart in FIG. 5(a) shows a typical wave form of an ON/OFF command (driver input) VinX, VinY or VinZ inputted to the pre-driver 3X, 3Y or 3Z from the main control board 05 of the inverter. The timing chart in FIG. 5(b) shows a typical wave form of a collector current of any one of the IGBTs 1X through 1Z flowing in response to the foregoing ON/OFF command when an overcurrent anomaly occurs.

The timing chart in FIG. 5(c) shows the output timing of the alarm signal ALM1 outputted from the pertinent pre-driver 3X, 3Y or 3Z based on the collector overcurrent of FIG. 5(b). The timing chart in FIG. 5(d) shows the change of the voltage between the electrodes P and N of the main DC power supply 02 with elapse of time.

The timing chart in FIG. 5(e) shows the output timing of the ON/OFF command (driver input) VinDB from the main control board 05 of the inverter, that monitors the voltage in FIG. 5(d) across the main DC power supply 02, to the pre-driver 3DB for the braking IGBT 1DB. The timing chart in FIG. 5(f) shows the timing, at which a current flows through the braking IGBT 1DB switched on and off based on the driver input VinDB in FIG. 5(e).

Note that FIGS. 5(e) and 5(f) show macroscopic transitions with elapse of time. In practice, the ON signal at the low level Lo of the driver input VinDB is an ON/OFF signal with a short period. The current in FIG. 5(f) through the braking switch 1DB has a wave form corresponding to the driver input VinDB shown in FIG. 5(e).

As soon as the pre-driver 3X, 3Y or 3Z detects anomalous increase of the collector current of the corresponding IGBT that reaches the alarm level Im1 at a time t1, the pertinent pre-driver 3X, 3Y or 3Z stops the operation of the corresponding IGBT, in the same manner as the conventional inverter does, and sets the signal on the alarm enable line 5 at a low level Lo to output an alarm signal ALM1. At the same time, the other pre-drivers, which have detected the low signal level Lo on the alarm enable line 5, turn off the corresponding IGBTs on the lower arm.

All the IGBTs on the upper arm of the inverter are also turned off in response to the OFF command outputted from the main control board 05 of the inverter that has detected the alarm signal ALM1. As all the IGBTs on the upper and lower arms are turned off, the voltage between the P and N electrodes of the main DC power supply 02 is raised by the energy regenerated from the motor 03.

As soon as the main control board 05 of the inverter detects that the voltage between the P and N electrodes of the main DC power supply 02 exceeds a predetermined value at a time t3, the main control board 05 of the inverter outputs the driver input VinDB, that is an ON command, which is, strictly describing, an ON/OFF signal with a short period to the pre-driver 3DB for the braking IGBT 1DB to intermittently switch on and off the braking IGBT 1DB. By intermittently switching on and off the braking IGBT 1DB, the energy regenerated from the motor is consumed by the resistor 04, so that the voltage across the main DC power supply 02 is prevented from rising and an over voltage exceeding the breakdown voltage of the semiconductor devices and such constituent elements of the IMP is not applied thereto.

According to the first aspect of the invention, the intelligent power module (IPM), that is a semiconductor apparatus incorporating the semiconductor switching devices, pre-drivers and control circuits in a package, outputs a preliminary alarm signal ALM2 without stopping the power conversion, as soon as a sign of an anomaly in any of the inverter switches is detected, in advance to turning off the inverter switches to remove the anomaly caused in any one of the inverter switches. The sign of the anomaly in any one of the inverter switches is detected when the collector current or the chip temperature of any one of the inverter switches exceeds a predetermined value higher than the normal value but lower than the anomalous value. The IMP according to the first aspect of the invention facilitates removing in advance the causes which may cause a real anomaly and avoiding anomalous sudden stop of the inverter that may affect the factory operation very badly.

The IMP according to the second aspect of the invention includes semiconductor switching devices constituting the bridge circuit for power conversion or inverter switches, a semiconductor switching device or braking switch for switching on and off a current for consuming the regenerated energy from a motor, pre-drivers and control circuits thereof in a package. Any one of the protection circuits turns off the corresponding one of the inverter switches and the braking switch and outputs an alarm signal via a common signal line when the anomaly is caused in the corresponding one of the inverter switches and the braking switch. The other pre-drivers of the inverter switches, which have received the alarm signal via the common signal line, turn off the corresponding inverter switches, but the pre-driver for the barking switch does not turn off the barking switch even when an alarm signal is outputted from any one of the pre-drivers for the inverter switches.

Therefore, even when the inverter stops suddenly and the power supply voltage rises due to the regenerated energy from the motor, the power supply voltage is prevented from further rising by consuming the regenerated energy by intermittently switching the braking switch. Thus, the over voltage exceeding the breakdown voltage of the semiconductor devices and such constituent elements of the IMP is not applied thereto.

While the invention has been explained with reference to the specific embodiments of the invention, the explanation is illustrative and the invention is limited only by the appended claims.

What is claimed is:

1. A semiconductor apparatus comprising:
   at least one semiconductor switching device for electric power conversion;
   at least one driver circuit electrically connected to said at least one semiconductor switching device, said at least one driver circuit switching on and off said at least one semiconductor switching device in response to an ON/OFF command inputted from an outside;
   at least one anomaly protection means electrically connected to the at least one semiconductor switching device for monitoring the same, said at least one anomaly protection means ordering said at least one driver circuit to turn off the at least one semiconductor switching device when the at least one anomaly protection means detects an anomaly in the at least one semiconductor switching device; and
   at least one anomaly predicting means electrically connected to the at least one semiconductor switching device, said at least one anomaly predicting means outputting a preliminary alarm signal when said at least one anomaly predicting means detects a sign of the anomaly in the at least one semiconductor switching device, and an alarm signal outwardly when the at least one anomaly protection means judges that the anomaly occurs in the at least one semiconductor switching device, said preliminary alarm signal and said alarm signal being digital signals outputted from a common output terminal, pulse widths thereof being different from each other.

2. A semiconductor apparatus according to claim 1, wherein said at least one anomaly protection means judges that the anomaly occurs in the at least one semiconductor switching device when a current flowing between main terminals of the at least one semiconductor switching device exceeds a first predetermined value higher than a normal value of the current, and said at least one predicting means outputs said preliminary alarm signal when said current flowing between the main terminals exceeds a second predetermined value higher than the normal value and less than the first predetermined value.

3. A semiconductor apparatus according to claim 1, wherein said at least one anomaly protection means judges that the anomaly occurs in the at least one semiconductor switching device when a chip temperature of the at least one semiconductor switching device exceeds a first predetermined temperature higher than a normal chip temperature, and said at least one anomaly predicting means outputs the preliminary alarm signal when the chip temperature of the at least one semiconductor switching device exceeds a second predetermined temperature higher than the normal chip temperature and less than the first predetermined temperature.

4. A semiconductor apparatus according claim 1, wherein said semiconductor apparatus includes a plurality of said semiconductor switches for constituting upper and lower arms of an inverter, each having one driver circuit, one anomaly protection means and one anomaly predicting means.

5. A semiconductor apparatus comprising:
   at least one semiconductor switch for constituting a main circuit for an inverter for driving a motor,
   a braking semiconductor switch electrically connected to the main circuit for turning on and off a current to consume energy regenerated from the motor;
   driver circuits electrically connected to said at least one semiconductor switch and said braking semiconductor switch, said driver circuits switching on and off said at least one semiconductor switch and said braking semiconductor switch in response to an ON/OFF command inputted from an outside;
   anomaly protection means electrically connected to said at least one semiconductor switch and said braking semiconductor switch for monitoring the same, respectively, said anomaly protection means, when detecting an anomaly in one of the at least one semiconductor switch and the braking semiconductor switch, ordering the corresponding driver circuit to turn off said one of the at least one semiconductor switch and the braking semiconductor switch;
   alarm signal outputting means electrically connected to the at least one semiconductor switch and the braking semiconductor switch, respectively, each of said alarm signal outputting means outputting an alarm signal through a common signal line when the anomaly occurs in one of the at least one semiconductor switch and said braking semiconductor switch; and
   at least one alarm signal receiving means electrically connected to the at least one semiconductor switch, said at least one alarm signal receiving means ordering the corresponding anomaly protection means to turn off the corresponding semiconductor switch in response to an alarm signal inputted from other alarm signal outputting means of other inverter semiconductor switch through said common signal line.

6. A semiconductor apparatus according to claim 5, wherein said semiconductor apparatus includes a plurality of said semiconductor switches for constituting upper and lower arms of the inverter, each having one driver circuit and one anomaly protection means.

7. A semiconductor apparatus according to claim 6, wherein said at least one alarm signal receiving means turns off said plurality of semiconductor switches.

* * * * *

UNITED STATES PATENT AND TRADEMARK OFFICE
CERTIFICATE OF CORRECTION

PATENT NO. : 6,459,380 B1
DATED : October 1, 2002
INVENTOR(S) : Manabu Watanabe and Tamao Kajiwara It is certified that error appears in the above-identified patent and that said Letters Patent is hereby corrected as shown below:

<u>Title page,</u>
Item [57], ABSTRACT,
Line 6, change "to" to -- of --;

<u>Column 2,</u>
Line 28, change "correspond" to -- corresponding --;

<u>Column 6,</u>
Line 22, change "to turning" to -- of turning --;

<u>Column 7,</u>
Line 42, change "pre-divers" to -- pre-drivers --; and

<u>Column 10,</u>
Line 44, change "in advance to" to -- in advance of --.

Signed and Sealed this

Seventh Day of January, 2003

JAMES E. ROGAN
*Director of the United States Patent and Trademark Office*